United States Patent [19]

Dubs et al.

[11] 4,165,402
[45] Aug. 21, 1979

[54] CHIP-REMOVING MACHINING METHOD AND APPARATUS FOR SEMICONDUCTING CRYSTALS, SPECIFICALLY SUITED FOR THE PRODUCTION OF FORCE AND PRESSURE MEASURING CELLS

[75] Inventors: Walter Dubs, Winterthur; Georg Preiss, Wiesendangen, both of Switzerland

[73] Assignee: Kistler Instrumente AG, Switzerland

[21] Appl. No.: 687,106

[22] Filed: May 17, 1976

[30] Foreign Application Priority Data

May 16, 1975 [CH] Switzerland .................. 006481/75

[51] Int. Cl.² .................. B01J 17/00; B23B 1/00; H01L 21/461
[52] U.S. Cl. .................. 428/64; 428/539; 82/1 C; 73/777; 29/583; 407/119; 409/131
[58] Field of Search .................. 82/1 C, 46; 408/1, 145; 90/11 C; 29/576 T, 95, 583; 125/10, 39; 73/88.5 SD; 428/64, 119, 539, 156

[56] References Cited

U.S. PATENT DOCUMENTS

| | | | |
|---|---|---|---|
| 2,127,998 | 8/1938 | Jearum | 125/39 |
| 2,967,344 | 1/1961 | Mueller | 29/576 T |
| 3,025,738 | 3/1962 | Winkler et al. | 82/70.2 |
| 3,270,554 | 9/1966 | Pfann | 29/576 T |
| 3,292,128 | 12/1966 | Hall | 29/576 T |
| 3,312,879 | 4/1967 | Godejahn, Jr. | 29/576 T |
| 3,365,794 | 1/1968 | Botka | 29/576 T |
| 3,399,442 | 9/1968 | Jones et al. | 29/95 R |
| 3,555,937 | 1/1971 | Nicodemas | 408/145 |

OTHER PUBLICATIONS

"Diamond Tool," E. Biedermann et al., IBM Tech. Disclosure Bulletin, vol. 16, No. 9, Feb. 1974.

*Primary Examiner*—Leonidas Vlachos
*Attorney, Agent, or Firm*—Craig and Antonelli

[57] ABSTRACT

A method and apparatus for shaping semiconducting crystals for utilization in force and pressure measuring devices by chip removing machining of at least one surface portion of the crystal member. The shaping is effected by mounting the crystal member to be shaped and a ground cutting tool with respect to one another and rotating and contacting the tool and crystal member with respect to one another so as to remove a surface portion from the crystal. In this manner, many individual crystals can be shaped in an identical manner with high accuracy and with substantially no wear of the cutting tool.

22 Claims, 11 Drawing Figures

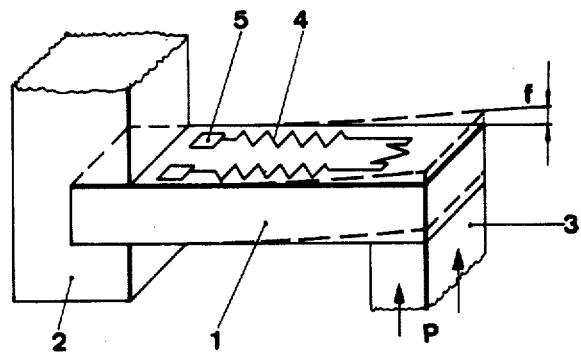
Fig.1
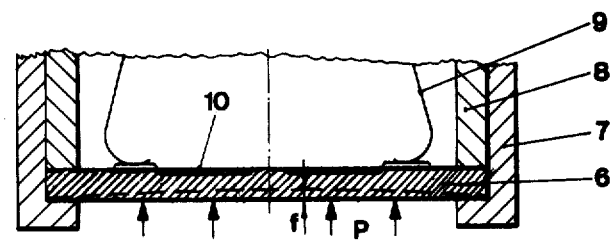
Fig.2
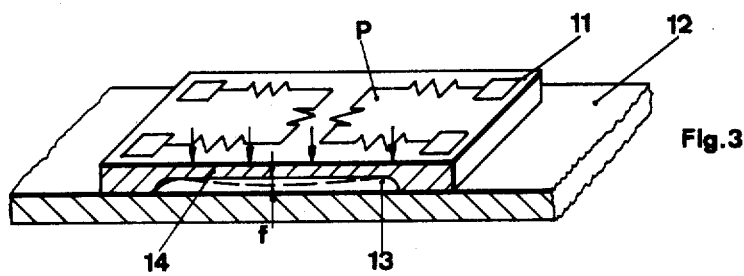
Fig.3
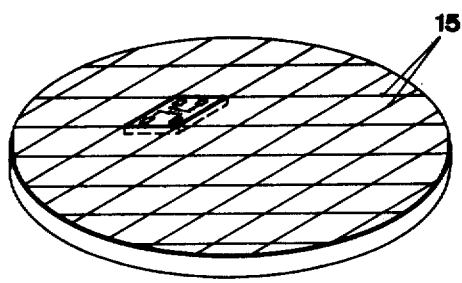
Fig.4
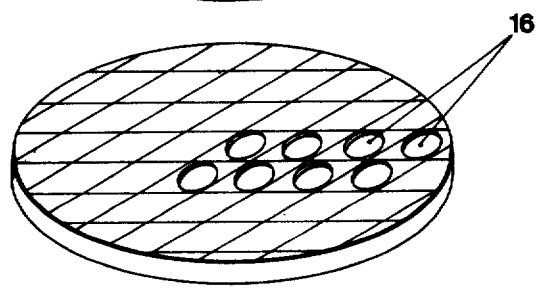

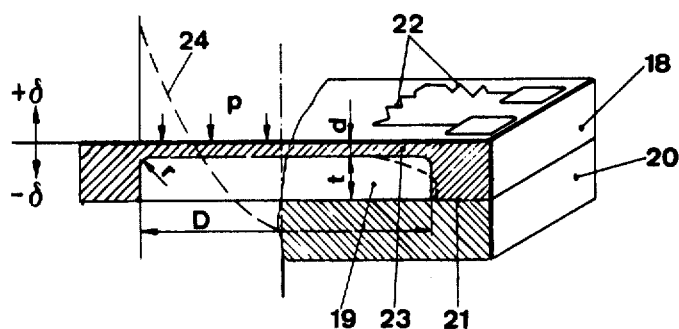
Fig. 5
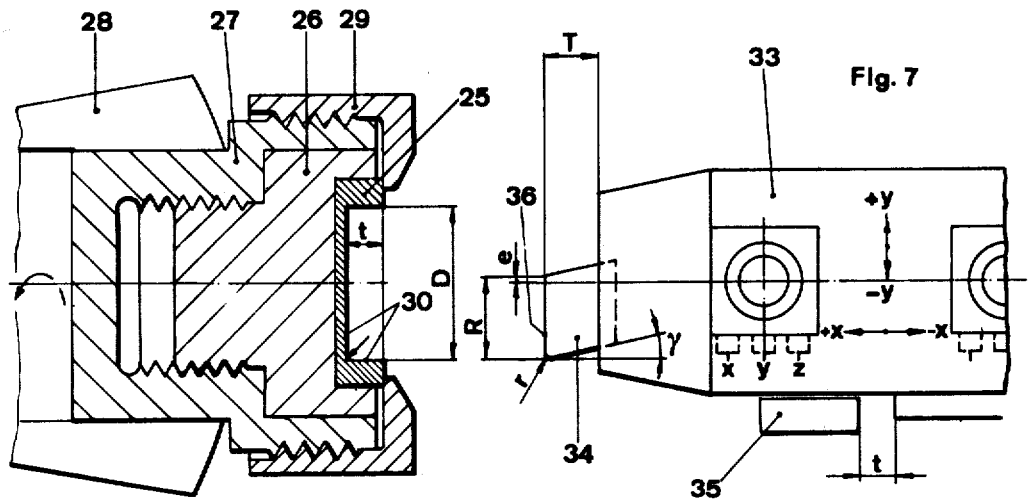
Fig. 6
Fig. 7
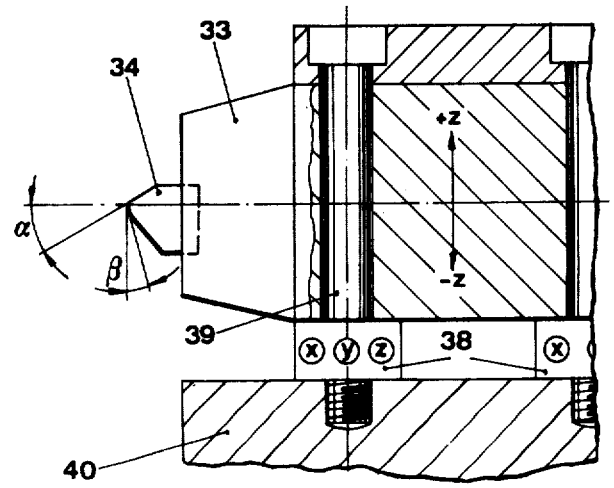
Fig. 8

CHIP-REMOVING MACHINING METHOD AND APPARATUS FOR SEMICONDUCTING CRYSTALS, SPECIFICALLY SUITED FOR THE PRODUCTION OF FORCE AND PRESSURE MEASURING CELLS

In the measuring technique for mechanical quantities, such as pressure, force and acceleration, in recent years the use of semiconducting crystals with diffused resistance paths, which are designated as piezo-resistive transducers, have become increasingly widespread. Thus, according to their directions of orientation, the semiconducting crystals are shaped such that the mechanical stress, for example due to bending, compression, or tension, is concentrated at the points of the resistance paths. The resistance paths are generally used in a half or full bridge circuit.

Today, silicon is mainly used as the carrier crystal of the measuring cells, since a large selection of varied technologies from the semiconductor industry is available with this material, however, other semiconducting crystals are being tested for similar purposes, in particular, for higher operational temperatures.

The requirements of transducer manufacture are in many cases different from those of transistor and electronic component production, especially because the semiconductor members in the transducer are stressed not only electrically but also mechanically. The problems of introducing power to the semiconductor members thus involve quite new tasks. If the semiconducting crystals in the transistor and electronic component industry are generally produced as simple rectangular solid plates and are soldered to a base, then in the transducer they are necessarily formed as a complicated member as a result of the double function. Shapes such as transverse beams, deflection diaphragms, tensile bars and compression members and the like have become known. In all known cases, these shapes of semiconducting crystal cells are produced according to the known techniques of electronic component manufacture. The crystal parts are therefore produced from semiconductor wafer plates so that a larger number of sensor members can be treated simultaneously, after which they are cut by the diamond cutting technique and the wafer plates are broken into individual members. Before or after these operations, grinding and lapping operations or electrochemical processes are frequently carried out. For the substantially higher requirements of receiver construction, these machining possibilities taken over from electronics production mean a narrow limitation of the profiling. In addition, the known techniques are unsuitable for removing large amounts of material, which is necessary in receiver construction utilizing substantially larger crystal parts.

It is therefore an object of the present invention to provide completely new machining methods and apparatus for shaping of crystal members, since the simple plates used hitherto and generally of rectangular shape are generally unsatisfactory in receiver construction.

These and other objects, features and advantages of the present invention will become more apparent from the following description when taken in connection with the accompanying drawings which show, for purposes of illustration only, several embodiments in accordance with the present invention, and wherein:

FIG. 1 shows a commercial crystal measuring cell which is constructed as a transverse beam;

FIG. 2 shows a commercial crystal measuring cell which is constructed as a pressure diaphragm;

FIG. 3 shows a commercial crystal measuring cell which is formed as a pressure element with a reference pressure space;

FIG. 4 shows a commercial wafer plate with scored division for individual crystals;

FIG. 5 shows a crystal measuring cell machined according to the method of the invention;

FIG. 6 shows a clamping device of the machining method according to the invention;

FIG. 7 shows an example of a machining tool according to the invention in plan view;

FIG. 8 shows one example of a machining tool according to the invention in elevational view;

Figure 10:
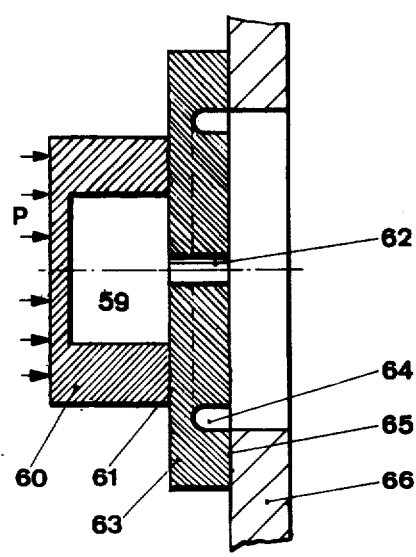

FIGS. 9a, b, c show three embodiments of crystal measuring cells according to the invention for measuring pressure and force;

FIG. 10 shows a further crystal measuring cell according to the invention having the base plate machined in a stress relieving manner;

FIGS. 11a and 11b show two further examples of crystal measuring cells according to the invention.

In FIG. 1, there is illustrated a commercial crystal measuring cell 1 constructed as a transverse beam with resistance paths 4 being diffused on the upper side, which paths are connected by way of the contact surface 5. The cell 1 is fixed in a support 2 and is actuated by a transmission plunger 3, due to which the deformation "f" is produced.

FIG. 2 shows the diaphragm part of a commercial pressure transducer, in which the semiconducting plate 6 is constructed directly as a deflection diaphragm. On its outer periphery, it is fixed in the receiver housing 7 by the support ring 8. Due to the measuring pressure "p", the semiconductor plate is deformed by the distance "f", due to which the diffused resistances 10 vary their resistance values in proportion to the pressure "p". The diffused measuring bridge is connected by leads 9.

FIG. 3 shows a further commercial pressure measuring arrangement, which consists of a semiconducting crystal plate 11, which contains a recess 13. Under the pressure "p", the diaphragm part 14 bends towards the reference pressure space 13, which is usually formed by etching of the crystal member, when it is still in the wafer. After this etching process, the crystal member 11 is soldered or affixed to the base plate 12 according to known methods, so that the reference space 13 is sealed.

FIG. 4 shows a commercial wafer plate, on which a row of semiconductor measuring cells have been diffused in a rectangular pattern according to known methods of semiconductor technology with breaking lines 15 being indicated. On the rear side of the wafer, reference pressure space recesses 16 which have been etched are illustrated, whereupon the wafer is scored with a diamond and broken into its elements.

FIG. 5 shows an embodiment of a crystal measuring cell for pressure measurement, produced according to the invention. It consists of the measuring plate 18, which contains a reference space 19 and the base plate 20 to which it is connected in a tight manner according to known methods. The base plate 20 may consist of the same semiconductor material or another material which has similar thermal expansion. The connecting point 21 of the two plates is in all cases an interference part, which it is desired to keep remote from the sensitive diaphragm part 23. In the case of temperature variations within the measuring cell, unfavorable reactions may be transmitted to the measuring diaphragm by the interference point 21, which should be avoided. The shape of the measuring cell according to the invention therefore opens into a substantially deeper reference space 19, the depth "t" of which in relation to the diameter "D" may reach the value 1.0, FIG. 5 shows a value of approximately 0.2. With the known methods of etching, a maximum value of 0.1 may be obtained, since otherwise the transition radius "r" becomes too large. For producing deeper reference bores, the method of lapping with sticks and lapping branches developed in the watch jewel technique would be suitable or the use of ultrasonic waves may possibly be envisaged. All these methods of providing troublefree and repeatable accurate transition parts "r" in crystal measuring cells, have proved unsatisfactory.

The repeatable accurate stress distribution curve 24, which is produced in the diaphragm surface in the case of a predetermined pressure "p" depends to a major extent on the surface condition and on the size of the transition radius "r". In the manufacture of crystal measuring cells, mechanical repeatability is thus of very great significance, which requires the highest precision in the machining of the underside of the diaphragm, otherwise the sensitivity and linearity from measuring cell to measuring cell prove different. Since the measuring cells and upper side of the diaphragm are anyway troublefree lapped plane surfaces, then it is also necessary that the underside is produced with the same precision and repeatability.

According to the present invention, this faithful highly precise diaphragm underside is produced with a finishing tool, which has no wear, according to methods of chip removing machining. For this, a single crystal, for example a diamond is soldered or affixed in a support tool in a suitable orientation and is ground as a form cutting tool such that the desired finished shape of the underside of the diaphragm is produced with only the feed movement of the tool, with high rotation. It is possible to allow the workpiece, i.e., the measuring cell, or the tool to rotate, according to what proves advantageous from the manufacturing point of view. The single crystal used must have a hardness of at least 9 Mohs. Apart from diamond, corundum or silicon carbide crystals may also be used. The cutting angle ground on the cutting face is of great significance.

As shown in FIG. 6, a crystal measuring plate 25 is placed in synthetic insert 26 of a lathe mandrel 27 and clamped by a clamping nut 29. The lathe mandrel 27 is mounted in a chuck 28 of the lathe. The clamping of the diffused crystal measuring plate 25, which is centered at the four corners, must be achieved such that no relative rotation occurs between the synthetic insert 26 and the diffused surface of the measuring plate 25, due to which damage to the measuring paths would be caused. However, it is also possible that a complete unbroken wafer plate is clamped in a similar manner and treated with a rotating tool according to the invention.

The cutting tool according to the invention is illustrated in plan view in FIG. 7 and consists of a support 33, in which the specially ground and orientated single crystal, for example a diamond is soldered or affixed according to known methods. In the machining operation, the form cutting crystal 34 which is installed very accurately as regards height and front edge, is moved at a programmed speed in the X direction towards the stop 35, without carrying out a movement in the Y direction at the same time. Thus, the afore-described value of the bore hole D is removed from the crystal plate 25 by the cutting edge 36 directly in one operation, at the desired depth "t". The length "T" of the projecting diamond 34 must therefore be somewhat greater than the depth "t" of the bore. Advantageously, the width "R" of the cutting edge 36 is somewhat greater than D/2, so that an overlap dimension of approximately 0.1 D results. The lower side 30 of the diaphragm of the measuring cell 25 may be produced with the greatest precision by the form cutting crystal 34, on hundreds of cells, without wear of the tool.

FIG. 8 shows the tool according to the present invention in elevation. A clearance angle "$\gamma$" of approximately 5°, a negative cutting angle "$\alpha$" of approximately 8° and an angle of incidence $\beta$ of approximately 5° have proved to be a suitable grinding angle on the form cutting crystal 34. When mounting the two on the machine, the front edge 36 is arranged exactly at right-angles to the axis of rotation, by optical means. In order to make the very delicate recessing operation independent of the skill of the operator, it is proposed to clamp the steel holder 33 to the machine support 40 by means of a clamping screw 39, above the single of multi-component force measuring cells 38. Such measuring cells provided with a bore are commercially available. With a measuring device of this type and a conventional plotting apparatus, the machining operation according to the invention may be partly or fully automated, which is to the advantage of the expensive tools and workpieces.

Figure 9:
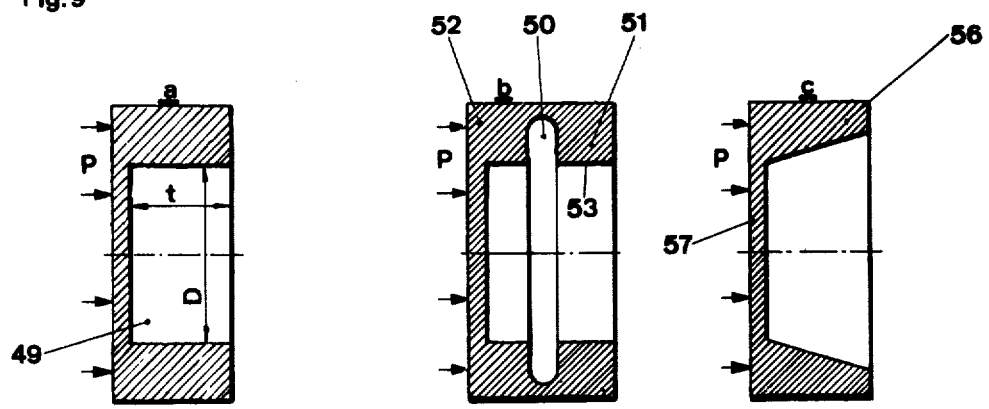

FIG. 9 shows three examples of crystal measuring cells which are machined according to the machining method of the invention, and in particular where internal machining has been carried out. Thus, FIG. 9a shows a crystal measuring cell with a particularly deep diaphragm underside 49, whereof the depth "t" may obtain approximately the value of "D", i.e. of the diameter of the recess.

FIG. 9b shows a crystal measuring cell formed by two cutting operations according to the invention. After cutting the bore 53, a radial recess 50 is produced with a further tool according to the invention. Thus, a mechanical-resilient separation of the mounting part 51 from the diaphragm part 52 is facilitated, which provides considerable advantages in the reduction of external effects by way of the mounting part, in particular as a result of thermal stresses.

FIG. 9c shows a further machining possibility according to the invention where the underside of the diaphragm is constructed in a conical manner.

FIG. 10 shows an embodiment of an assembled crystal measuring cell. In this case, the crystal measuring cell 60 is fixed to the crystal base plate 63 at the soldered point 61 in a tight manner. The reference space 59 is connected by means of a bore 62. The crystal base plate 63 is connected to the receiver frame 66 and insulated resiliently from the frame 66 by the recess 64, which reduces the effects of thermal expansions on the measuring cell 60. The reference space 59, the bore 62 and recess 64 are machined by methods of the present invention before assembly.

Figure 11:
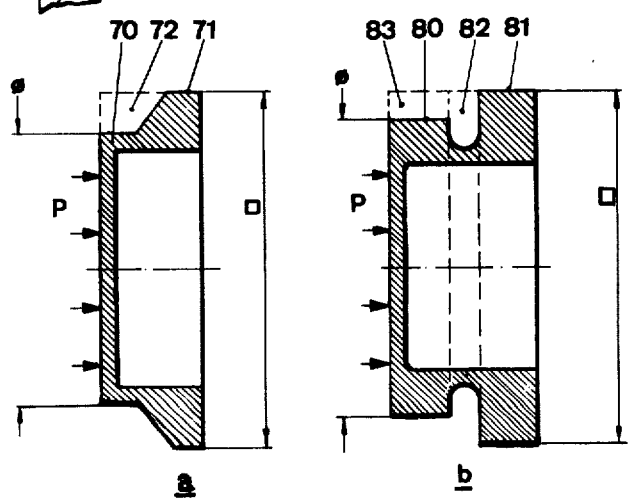

FIG. 11 shows two examples of crystal measuring cells which are produced by internal and external machining according to the invention.

FIG. 11a shows a resilient diaphragm support part 70, which is given a cylindrical shape, whereas the mounting part 71 remains rectangular. The portion 72 is removed in a cutting operation with a form cutting crystal according to the invention. In FIG. 11b, two external operations are shown with respect to the internal machining, namely the cutting operation to remove portion 82 and an operation for removing portions 83, which gives the diaphragm flange 80 a cylindrical surface. The recess formed by removing portion 82 serves for insulating the diaphragm flange 80 from the mounting flange 81 as regards stress.

Apart from these examples of application illustrated, a number of further shaping possibilities for crystal measuring cells and their base plates are naturally conceivable. Due to the combination of techniques taken from the semiconductor industry, together with the chip removing machining methods according to the invention, semiconducting crystal measuring cells can be produced economically for the first time, which can be manufactured with high precision at the critical points which are subject to mechanical stress and in particular in a satisfactory repeatable manner. The free formation of the crystal measuring cells facilitated in this way, in particular due to the spacing and resilient insulation of the sensitive diaphragm parts from the interference parts of the mounting flanges, provide substantial improvements as regards linearity, hysteresis and background stability, due to which new technical progress may be made in the quality of piezo-resistive measured value receivers.

Disassociation from machining methods such as lapping, grinding, sawing, scoring, ultrasonic boring etc. which were hitherto taken for granted and adopted from the semiconductor industry, facilitate the production of new crystal measuring cells which may also be used for direct force measurement, due to which new fields of application for piezo-resistive semiconductor measured value receivers can be envisaged.

Finally, the machining method according to the invention with the form cutting crystal provides a machining speed which cannot even be approached by any other method. This also produces advantageous economic aspects. The invention is currently used mainly on crystal measuring cells made from silicon crystal, however, it may also be used on other semiconducting materials with a Mohs hardness of 7, such as on gallium phosphide crystals, on gallium arsonide crystals and the like for example. Additionally, while the present disclosure illustrates the chip removing machining in accordance with a lathe, such machining may also be effected with a boring or milling machine.

The form cutting crystal according to the invention, which is an orientated individual crystal, is currently made from diamond, but other orientated single crystals such as corundum are likewise suitable in the variants ruby and sapphire and silicon carbide, etc., provided that they have a Mohs hardness of over 9. Sintered diamonds may also be used.

While we have shown and described several embodiments in accordance with the present invention, it is understood that the same is not limited thereto but is susceptible of numerous changes and modifications as known to those skilled in the art and we therefore do not wish to be limited to the details shown and described herein but intend to cover all such changes and modifications as are encompassed by the scope of the appended claims.

We claim:

1. A method comprising the step of chip removing machining at least one surface portion of a semiconducting crystal member so as to provide a desired shape for the crystal member by utilizing a chip removing tool having a ground single crystal cutting element with a Mohs hardness greater than 9, providing the single crystal ground cutting element with a clearance angle $\gamma$ of approximately 5°, a negative cutting angle $\alpha$ of approximately 8° and an angle of incidence $\beta$ of approximately 5°, the step of chip removing machining including shaping by rotating and contacting one of the semiconducting crystal member and the cutting element with respect to the other while feeding one of the semiconducting crystal member and the cutting element toward the other in only a single direction, penetrating the surface portion of the semiconducting crystal member, and forming at least one depression therein by chip removing machining.

2. A method according to claim 1, wherein the step of chip removing machining at least one surface portion of the crystal member includes utilizing at least one of a lathe, boring machine, and milling machine for the chip removing machining.

3. A method according to claim 1, wherein the step of chip removing machining includes mounting the semiconducting crystal member on a first supporting member, mounting the chip removing tool on a second supporting member for maintaining the tool in a predetermined position, and rotating the semiconducting crystal member relative to the tool while penetrating a planar end surface of the semiconducting crystal member with the tool to form the at least one depression therein.

4. A method according to claim 3, further comprising the steps of removing the shaped crystal member from the first support member, mounting another crystal member on the first support member, and utilizing the same chip removing tool for shaping the another crystal member in the same manner as the removed crystal member whereby repeatability of shape of crystal members with high accuracy is provided.

5. A method according to claim 1, wherein the ground cutting element is one of a single crystal diamond, single crystal of silicon carbide, and a sintered diamond.

6. A method according to claim 1, wherein the semiconducting crystal member is an oriented semiconducting crystal with a Mohs hardness of 7.

7. A method according to claim 6, wherein the oriented semiconducting crystal is formed of one of an oriented silicon crystal, an oriented gallium phosphite crystal, and an oriented gallium arsenite crystal.

8. A method according to claim 6, further comprising incorporating the shaped crystal member as a sensor in at least one of a pressure, force and acceleration receiver, the shaped crystal member forming a deformation member with force introduction and discharge surfaces.

9. A method according to claim 1, including shaping the semiconducting crystal member to form a diaphragm element of a transducer by chip removing machining at least one depression therein.

10. A method according to claim 1, wherein the step of forming at least one depression includes forming a rotationally symmetric depression in the semiconducting crystal member having a depth at least about 0.2 times the diameter of the depression.

11. A method according to claim 10, wherein the step of shaping includes externally shaping a surface of the crystal member.

12. A shaped semiconducting crystal member shaped by the method according to claim 1 and having a rotationally symmetric depression with a depth at least about 0.2 times the diameter of the depression.

13. A shaped member according to claim 12, wherein the shaped member is formed of at least one of an oriented silicon crystal, an oriented gallium phosphide crystal, and an oriented gallium arsonide crystal.

14. A shaped member according to claim 12 for incorporation as a sensor in at least one of a pressure, force and acceleration receiver, the shaped member being a deformation member having force introduction and discharge surfaces.

15. A shaped member according to claim 12, having an externally shaped surface shaped by the chip removing tool.

16. A shaped member according to claim 12, having at least one of a groove and recess formed by chip removing machining therein.

17. A shaped member according to claim 12, wherein the shaped member is formed of an oriented semiconducting crystal with a Mohs hardness of 7.

18. A shaped semiconducting crystal member shaped by the method of claim 1.

19. A method according to claim 1, wherein the step of providing a chip removing tool includes providing the ground single crystal cutting element with a width extending transversely to the feed direction greater than ½ the diameter of the depression to be made in the semiconducting crystal member with the cutting element.

20. A shaped semiconducting crystal member made by the method of claim 19 and having a rotationally depression with a depth at least about 0.2 times the diameter of the depression.

21. A machining tool for chip removal machining of at least one surface portion of a semiconducting crystal member, said machining tool being constructed as a shaping tool having a ground cutting member, said ground cutting member being a single crystal provided with a hardness greater than 9 Mohs and having a clearance angle $\gamma$ of approximately 5°, a negative cutting angle $\alpha$ of approximately 8° and an angle of incidence $\beta$ of approximately 5°.

22. A machining tool according to claim 21, wherein the ground cutting member is one of a single crystal diamond, single crystal of silicon carbide, and a sintered diamond.

* * * * *